United States Patent [19]

Mancke et al.

[11] 4,059,467
[45] Nov. 22, 1977

[54] METHOD FOR REMOVAL OF ELASTOMERIC SILICONE COATINGS FROM INTEGRATED CIRCUITS

[75] Inventors: Ralph Gustavus Mancke, Bethlehem; Nicholas Alec Soos, Macungie, both of Pa.

[73] Assignee: Bell Telephone Laboratories, Incorporated, Murray Hill, N.J.

[21] Appl. No.: 727,057

[22] Filed: Sept. 27, 1976

[51] Int. Cl.² .............................................. B29B 3/00
[52] U.S. Cl. ...................................... 156/80; 29/588; 156/247; 156/268
[58] Field of Search ................. 156/80, 155, 257, 263, 156/268, 344, 498, 248; 29/575, 588; 264/28, 36, 138, 139, 154, 237, 344, 348; 427/154, 155, 271, 273

[56] References Cited

U.S. PATENT DOCUMENTS

| 2,469,849 | 5/1949 | Silver | 156/80 |
| 3,690,984 | 9/1972 | Wanesky | 156/235 |
| 3,773,578 | 11/1973 | Glendinning et al. | 156/17 |
| 3,969,813 | 7/1976 | Minetti et al. | 156/344 |

*Primary Examiner*—Caleb Weston
*Attorney, Agent, or Firm*—Lester H. Birnbaum

[57] ABSTRACT

A technique is disclosed for the mechanical removal of elastomeric encapsulants from integrated circuits. The encapsulant to be removed is outlined by cutting, and the outlined area is cooled sufficiently either during or subsequent to cutting such that the encapsulant may be removed by gripping one edge with tweezers and peeling from the circuit.

8 Claims, 3 Drawing Figures

METHOD FOR REMOVAL OF ELASTOMERIC SILICONE COATINGS FROM INTEGRATED CIRCUITS

BACKGROUND OF THE INVENTION

This invention relates to the removal of encapsulants from the integrated circuits.

Many integrated circuits are coated with an elastomeric encapsulant to protect the circuit components against condensed moisture, particulate matter, damage during assembly, and in some cases, light. After completion of the encapsulation process, it is often found that one or more components are defective. Since many of the circuits are quite complex and expensive, it is often economically feasible to repair a defective circuit rather than discard it. Repair can only be achieved after the encapsulant has been removed from the area containing the defective component.

Removal of encapsulating materials where the cohesive strength is greater than the adhesive strength does not present a problem. The area to be removed is outlined by cutting and the coating to be removed simply gripped at one edge with a tweezer and peeled off. It was found that other encapsulating materials where the cohesive strength is less than the adhesive strength cannot be as easily removed by this method because the encapsulant breaks apart when peeling is attempted. Furthermore, attempts to pry or lift the latter encapsulants often resulted in destruction or damage of many of the circuit components.

It is therefore a primary objective of this invention to provide a means that would enable non-peelable elastomeric encapsulants to be peeled from integrated circuits without damaging sensitive circuit components.

SUMMARY OF THE INVENTION

This and other objects are achieved in accordance with the invention by using low temperatures to temporarily modify the material properties of the encapsulant. The region of coating to be removed is defined by cutting through the encapsulant, and the region is cooled and peeled from the circuit. Cutting may be done either before or during cooling. In one embodiment of the invention, the outlined encapsulant is cooled with chilled nitrogen gas in the temperature range of $-60$ to $-90°$ C. The process allows an effective, convenient and reproducible method to remove elastomeric encapsulants that do not peel easily at room temperature from integrated circuits without permanently altering the circuit.

The foregoing will be more apparent from the following more particular description of the preferred embodiment of the invention as illustrated in the accompanying drawings.

DESCRIPTION OF THE PREFERRED EMBODIMENT

Figure 1:
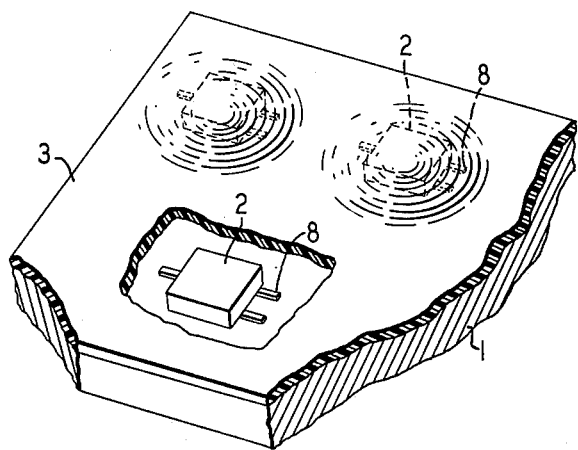
FIG. 1 is a perspective view of a portion of a typical hybrid integrated circuit.

Referring to FIG. 1, there is shown a portion of a hybrid integrated circuit which may utilize the present invention. As shown in FIG. 1, the circuit comprises an insulating substrate 1 with integrated circuit chips, 2, and associated conductors 8 bonded thereto. A cured encapsulant layer, 3, is deposited over the substrate 1 and chip 2. For the purposes of illustration, only three chips are shown on the substrate in FIG. 1 but it should be clear that a greater number of chips are usually formed on a typical integrated circuit along with further components such as resistors and capacitors.

Figure 2:
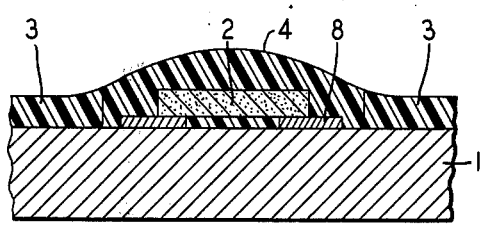
FIG. 2 is a cross-sectional view of a portion of the circuit of FIG. 1 at one stage of the process in accordance with one embodiment of the invention.

As shown in FIG. 2, in accordance with one embodiment of the present method, the region of encapsulant to be removed, 4, was outlined by cutting with a suitable non-metallic tool (not shown), such as a sharpened plexiglass rod. The encapsulant is typically an elastomeric (rubber) resin, made from a silicone, a silicone-organic copolymer, or a silicone-organic polymer blend, each containing siloxane bonds (Si-O-Si) as a major constituent. An example is a silicon rubber comprising a methoxy terminated dimethyl siloxane polymer and sold by Dow Corning Co. under the designation Q3-6550 RTV (room temperature vulcanizing), but the invention may be used with a number of encapsulants known in the art.

For easy removal of the encapsulant, it should be cooled such that its cohesive strength becomes greater than its adhesive strength. In accordance with the main feature of the invention, the area of encapsulant 4 to be removed was cooled to allow it to be peeled from the circuit. This may be achieved by cooling the entire circuit and encapsulant 3 or by the use of localized cooling of the portion of encapsulant 4 to be removed.

Figure 3:
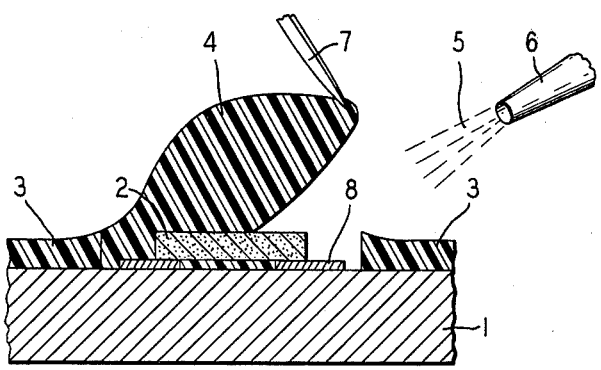
FIG. 3 is a cross-sectional view of the same circuit during another stage of the process in accordance with the same embodiment.

A particular method of cooling is shown in FIG. 3. A flow of chilled nitrogen gas 5 was projected from a nozzle 6 at an angle of 30° to 45° to the plane of the substrate 1. This range of angles facilitates peeling, although an angle from 0° to 90° is sufficient to allow the encapsulant to be readily peeled from the circuit. In this embdiment, using Dow Corning Q3-6550 RTV as an encapsulating material, the temperature range of $-60$ to $-90°$ C was used. It was discovered that the tear strength of the RTV increased dramatically upon cooling from room temperature to below $-60°$ C, as the encapsulant developed crystalline regions, thus increasing its peel capability. Whether this is the only reason for the development of peel capability is not presently known. The temperature range at which an encapsulant becomes peelable, as well as its precise causes, may vary with different materials, since physical and thermal characteristics of elastomers depend on polymer type and the types and amounts of added fillers and other constituents.

The encapsulant 4 was then gripped at one end with tweezer 7 and peeled from the substrate 1 as illustrated in FIG. 3. As the peeling progressed, the flow of chilled gas 5 was continuously aimed at the encapsulant-substrate interface and also at the peeled encapsulant where the peel force was being applied to insure sufficient cooling and maintain the increased tear strength.

The chilled nitrogen gas was obtained by flowing the gas through ¼ inch diameter coiled copper tubing submerged in a Dewar of liquid nitrogen in accordance with known techniques. A flow rate of 12-18 liters/minute was used, with the nozzle a distance of 1 - 1½ inches from the circuit. The temperature of the nitrogen gas at the encapsulant surface is easily controlled by the rate of flow of nitrogen through the coil and the distance of the nozzle from the circuit. Increasing the flow rate or decreasing the distance between nozzle and circuit will further cool the circuit, a well known technique to those skilled in the art.

Although the preferred embodiment of the invention has been described in detail, it is to be understood that various changes, substitutions and alterations can be made without departing from the spirit and scope of the invention.

What is claimed is:

1. In the fabrication of circuits on an insulating substrate, a method for removal of cured elastomeric encapsulants having a greater adhesive strength than cohesive strength from said substrate comprising the steps of:
    defining the region of encapsulant to be removed by cutting through said encapsulant at the boundaries of said region;
    cooling the region of said encapsulant such that the cohesive strength of the encapsulant becomes greater than its adhesive strength; and
    peeling off the encapsulant in said region.

2. The method according to claim 1 wherein the region of encapsulant is cooled to a temperature in the range $-60°$ to $-90°$ C.

3. The method according to claim 1 wherein the encapsulant comprises siloxane bonds as a major constituent and is selected from the group consisting of a silicone, a silicone-organic copolymer, and a silicone-organic polymer blend.

4. The method according to claim 3 wherein the encapsulant comprises a silicone rubber comprising a methoxy terminated dimethyl siloxane polymer.

5. The method according to claim 1 wherein the region is cooled by directing a stream of chilled gas at said region.

6. The method according to claim 5 wherein said chilled gas is nitrogen.

7. A method for removal of an encapsulant coating comprising a silicone rubber comprising a methoxy terminated dimethyl siloxane polymer from an insulating substrate comprising the steps of:
    defining the region of encapsulant to be removed by cutting through said coating;
    cooling the region of said encapsulant to the temperature range of $-60°$ to $-90°$ C by directing a flow of chilled nitrogen gas at said region at an angle of 30° to 45° to the plane of said substrate; and
    peeling off the encapsulant in said region while said nitrogen gas is directed at the interface between the encapsulant and substrate and at the peeled encapsulant.

8. A method for removing from an insulating substrate a cured encapsulant coating comprising siloxane bonds as a major constituent and selected from the group consisting of a silicone, a silicone-organic copolymer and a silicone polymer blend, wherein said encapsulant has a greater adhesive strength than cohesive strength, comprising the steps of:
    defining the region of encapsulant to be removed by cutting through said encapsulant at the boundaries of said region;
    cooling the region of said encapsulant to the temperature range of $-60°$ to $-90°$ C; and
    peeling off the encapsulant in said region.

* * * * *